(12) United States Patent
Lee et al.

(10) Patent No.: US 8,331,183 B2
(45) Date of Patent: Dec. 11, 2012

(54) MEMORY APPARATUS HAVING STORAGE MEDIUM DEPENDENT ON TEMPERATURE AND METHOD FOR DRIVING THE SAME

(75) Inventors: Sung Yeon Lee, Icheon-si (KR); Hyun Joo Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 162 days.

(21) Appl. No.: 12/983,231

(22) Filed: Dec. 31, 2010

(65) Prior Publication Data

US 2012/0106242 A1     May 3, 2012

(30) Foreign Application Priority Data

Oct. 29, 2010    (KR) ........................ 10-2010-0106591

(51) Int. Cl.
    *G11C 7/04*      (2006.01)
(52) U.S. Cl. .................. 365/211; 365/163; 365/189.07; 365/189.09
(58) Field of Classification Search .................. 365/211, 365/163, 189.07, 189.09
See application file for complete search history.

(56) References Cited

U.S. PATENT DOCUMENTS

| | | | |
|---|---|---|---|
| 6,735,546 B2 * | 5/2004 | Scheuerlein | 702/132 |
| 6,885,602 B2 * | 4/2005 | Cho et al. | 365/211 |
| 7,113,424 B2 * | 9/2006 | Happ et al. | 365/163 |
| 7,447,092 B2 | 11/2008 | Cho et al. | |
| 7,796,425 B2 * | 9/2010 | Choi et al. | 365/163 |
| 2003/0046020 A1 * | 3/2003 | Scheuerlein | 702/132 |
| 2004/0151023 A1 * | 8/2004 | Khouri et al. | 365/163 |
| 2005/0162303 A1 | 7/2005 | Cho et al. | |
| 2006/0109707 A1 | 5/2006 | Happ et al. | |
| 2008/0212362 A1 | 9/2008 | Choi | |
| 2011/0204957 A1 * | 8/2011 | Kameyama et al. | 327/512 |

FOREIGN PATENT DOCUMENTS

| | | |
|---|---|---|
| JP | 2005-122875 | 5/2005 |
| JP | 2005-346900 | 12/2005 |

* cited by examiner

*Primary Examiner* — Tuan T. Nguyen
(74) *Attorney, Agent, or Firm* — William Park & Associates Ltd.

(57) ABSTRACT

A memory apparatus includes a temperature detection block configured to detect temperature of an internal circuit and output a temperature detection signal, a current control block configured to receive the temperature detection signal and generate a pulse control signal, and a write driver configured to provide a program pulse having a compensated level and width to a memory cell in response to the pulse control signal.

20 Claims, 5 Drawing Sheets

MEMORY APPARATUS HAVING STORAGE MEDIUM DEPENDENT ON TEMPERATURE AND METHOD FOR DRIVING THE SAME

CROSS-REFERENCES TO RELATED APPLICATION

The present application claims priority under 35 U.S.C. §119(a) to Korean application number 10-2010-0106591, filed on Oct. 29, 2010, in the Korean Intellectual Property Office, which is incorporated herein by reference in its entirety.

BACKGROUND

1. Technical Field

The present invention relates to a semiconductor integrated circuit and a method for driving the same, and more particularly, to a memory apparatus having a storage medium dependent on temperature and a method for driving the same.

2. Related Art

Nonvolatile memory apparatuses maintain stored data even though power supply is cut off. Therefore, the nonvolatile memory apparatuses are widely adopted in computers, mobile telecommunication systems, memory cards, and so on.

A representative example of the nonvolatile memory apparatus that is widely used is flash memory. The flash memory adopts a memory cell structure such as a stacked gate structure. In such a flash memory, a film quality of a tunnel oxide layer should be improved, and a coupling ratio between cells should be increased, in order to enhance the reliability and program efficiency of flash memory cells.

Currently, a phase change memory apparatus having a random access property of DRAM is being developed as a replacement for flash memory.

In general, a phase change memory apparatus includes a plurality of word lines, a plurality of bit lines arranged in such a manner as to intersect the plurality of word lines, and a plurality of phase change memory cells in the respective intersection points between the word lines and the bit lines.

Each of the phase change memory cells includes a switching element coupled to a word line and a variable resistor element coupled between the switching element and a bit line. The variable resistor element may be formed of a phase change material whose resistance value changes according to the amount of current provided.

However, the variable resistor element of the phase change memory cell is influenced by temperature. For example, the resistance of the phase change material may be lower at a lower temperature, and higher at a higher temperature. That is, while the property change of the phase change material at a high temperature is larger than at room temperature, the property change at low temperature is smaller than at room temperature. Room temperature may be, for example, 25° C. to 60° C. Therefore, if a predetermined constant program pulse is provided regardless of temperature, since the resistance value of the phase change material may change with temperature, a data storage error may occur depending on the temperature at the time of storage.

SUMMARY

In one embodiment of the present invention, a memory apparatus includes a temperature detection block configured to detect temperature of an internal circuit and output a temperature detection signal, a current control block configured to receive the temperature detection signal and generate a pulse control signal, and a write driver configured to provide a program pulse having a compensated level and width to a memory cell in response to the pulse control signal.

In another embodiment of the present invention, a method for driving a memory apparatus includes generating a temperature detection signal by measuring internal temperature of a memory circuit, generating a plurality of pulse control signals in response to the temperature detection signal, and generating a program pulse in response to the pulse control signals.

BRIEF DESCRIPTION OF THE DRAWINGS

Features, aspects, and embodiments are described in conjunction with the attached drawings, in which.

DETAILED DESCRIPTION

Hereinafter, a current control apparatus and a phase change memory having the same according to the present invention will be described below with reference to the accompanying drawings through exemplary embodiments.

Figure 1:
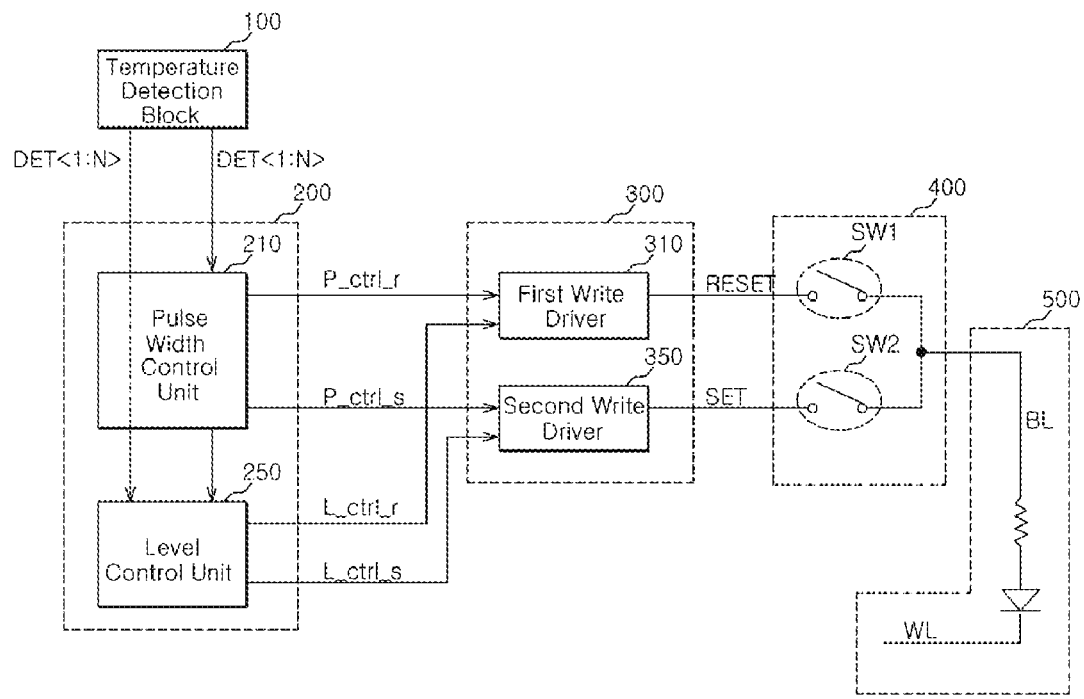
FIG. 1 is a schematic block diagram of a phase change memory apparatus according to one embodiment of the invention.

FIG. 1 is a schematic block diagram of a phase change memory apparatus according to one embodiment.

Referring to FIG. 1, the memory apparatus 10 according to an embodiment may include a temperature detection block 100, a current control block 200, a write driver block 300, a switching block 400, and a memory cell 170.

Figure 2:
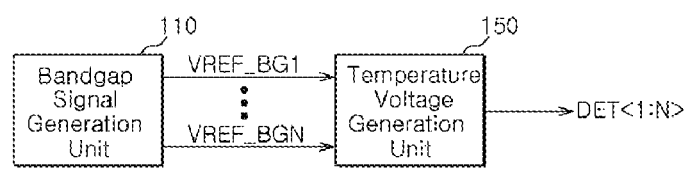
FIG. 2 is a detailed block diagram of a temperature detection block according to an embodiment of the invention.

Referring to FIG. 2, the temperature detection block 100 includes a bandgap signal generation unit 110 and a temperature voltage generation unit 150. The bandgap signal generation unit 110 includes a temperature-dependency voltage generation section configured to generate a plurality of temperature-dependent reference voltages VREF_BG<1:N> using bandgap property, and a temperature-independent reference voltage generation section configured to generate a reference voltage VREF_BG0. The temperature-dependent voltage generation section and the temperature-independent reference voltage generation section are not illustrated in FIG. 2.

Figure 3:
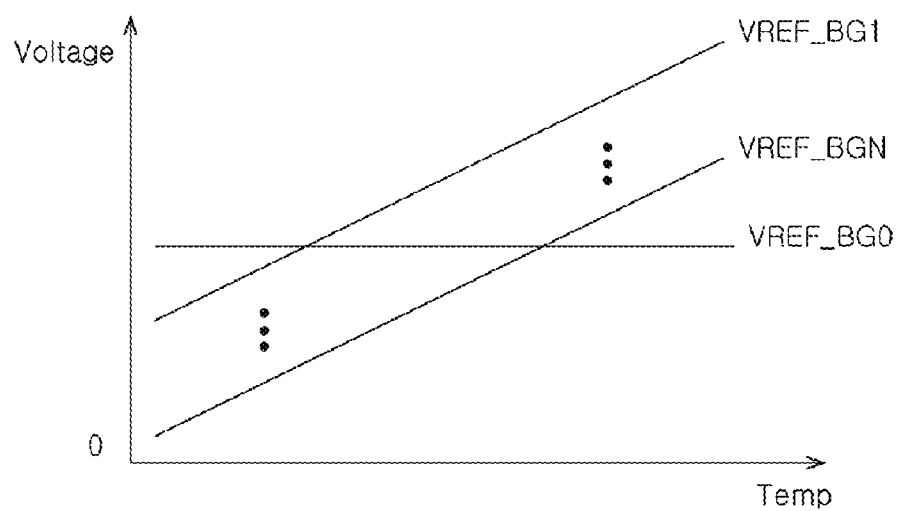
FIG. 3 is a graph showing output voltages of a bandgap signal generation unit according to an embodiment of the invention.

Referring to FIG. 3, the plurality of temperature-dependency reference voltages VREF_BG<1:N> generated by the temperature-dependent voltage generation section increases in proportion to temperature, and the reference voltage VREF_BG0 generated by the temperature-independent reference voltage generation section has a constant level which generally has no relation with temperature.

Figure 4:
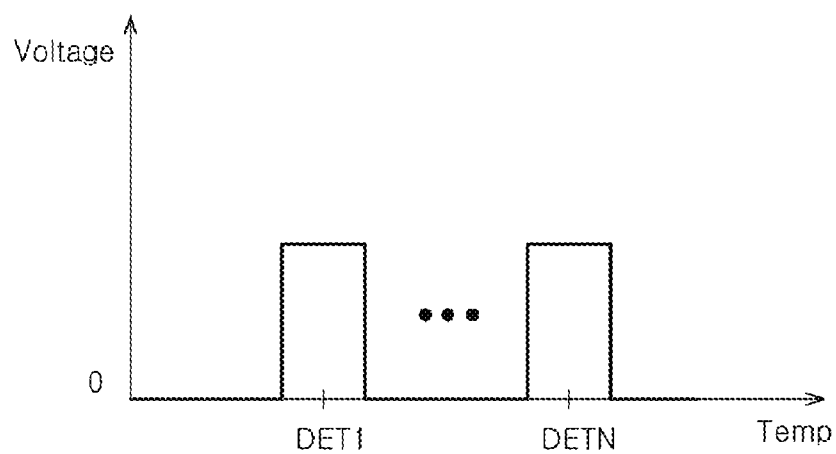
FIG. 4 is a graph showing output voltages of a temperature voltage generation unit.

Meanwhile, referring to FIG. 4, the temperature voltage generation unit 150 generates a constant pulse DET<1:N>, that is, a temperature detection signal at every temperature-variation period, by using the temperature-dependent reference voltages VREF_BG<1:n> and the temperature-independent reference voltage VREF_BG0.

The current control block 200 is configured to receive the temperature detection signals DET<1:N> and provide control signals P_Ctrl_r, P_Ctrl_s, L_Ctrl_r, and L_Ctrl_s for controlling a current pulse width or a pulse amplitude to the write driver block 300. The current control block 200 may include a pulse width control unit 210 and a level control unit 250.

The pulse width control unit 210 is configured to output the pulse width control signals P_Ctrl_r and P_Ctrl_s in response to the temperature detection signals DET<1:N>. The pulse width control unit 210 may include a program state machine which receives a temperature code depending on the temperature detection signals DET<1:N> and changes a voltage transfer path.

Figure 5:
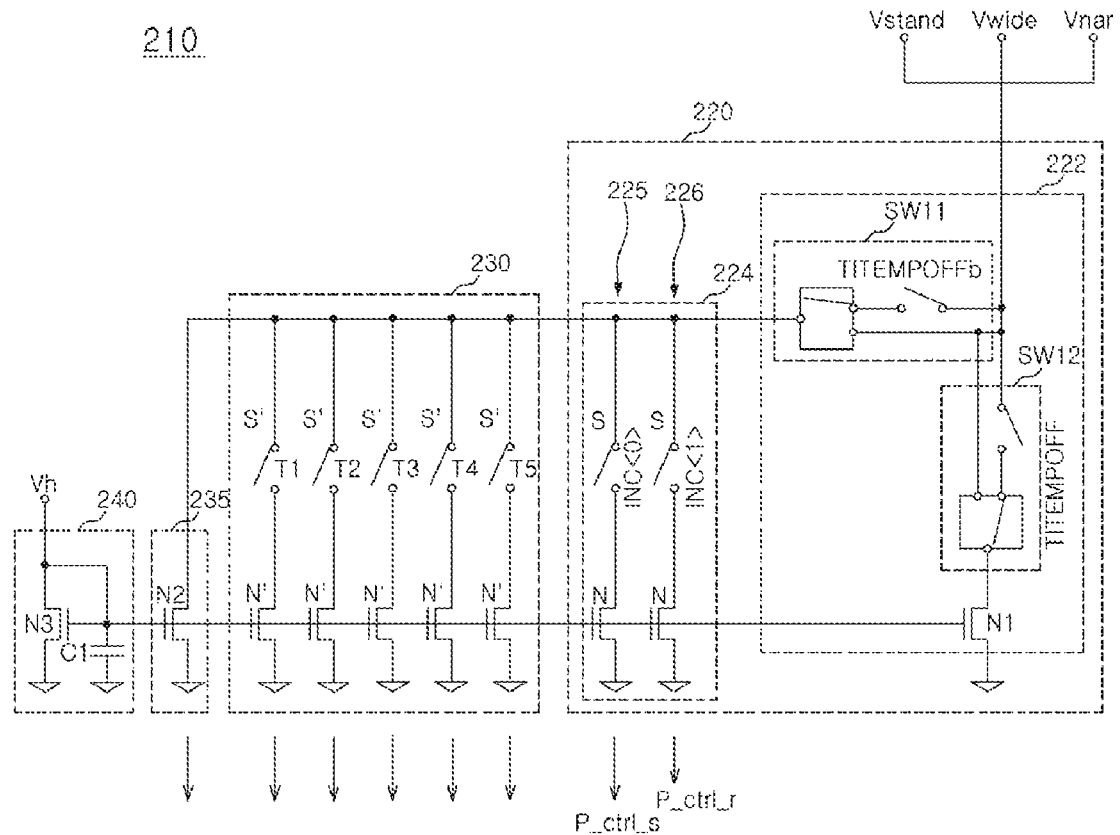
FIG. 5 is an internal circuit diagram of a pulse width control unit according to an embodiment of the invention.

Referring to FIG. 5, the pulse width control unit 210 according to an embodiment may include an initial setting section 220, a pulse width change section 230, a base current setting section 235, and an initial driving section 240.

The initial setting section 220 may include a rising/falling setting section 222 and a mode setting section 224. The rising/falling setting section 222 may include a bypass section N1, a rising setting section SW11 coupled between the mode setting section 224 and driving voltage terminals Vstand/Vhigh/Vlow, and a falling setting section SW12 coupled between the bypass section N1 and the driving voltage terminals Vstand/Vhigh/Vlow.

The rising setting section SW11 and the falling setting section SW12 are driven in response to first and second control signals TITEMPOFF and TITEMPOFFb having opposite phases, respectively. For example, when the second control signal TITEMPOFFb is enabled, the rising setting section SW11 is driven to transfer voltages and currents to the mode setting section 224 and the pulse width change section 230. When the first control signal TITEMPOFF is enabled, the falling setting section SW22 couples the driving voltages Vstand, Vhigh, and Vlow provided to the initial setting section 220 to ground through the bypass section N1. As well known, the first and second control signals TITEMPOFF and TITEMPOFFb may be derived from, for example, the temperature detection signals DET<1:n>.

The mode setting section 224 may include first and second legs 225 and 226 coupled in parallel. Each of the first and second legs 225 and 226 may include a switch S and an NMOS transistor N coupled in series between the rising setting section SW11 and a ground terminal. The respective switches S of the first and second legs 225 and 226 may be driven in response to first and second input control signals INC<0> and INC<1>. The first and second legs 225 and 226 may be selectively driven or simultaneously driven, and a set mode or reset mode is decided by driving the first and second legs 225 and 226, respectively. In this case, the driving voltages may be selected by the level control unit 250 which will be described below.

The pulse width change section 230 is coupled between the initial setting section 220 and the base current generation section 235, and may include a plurality of legs coupled in parallel. Each of the legs may include a switch S' and an NMOS transistor N' coupled in series, as in the first and second legs 225 and 226 of the mode setting section 224. The plurality of legs composing the pulse width change section 230 is coupled in parallel to each other. Furthermore, the switches S' of the respective legs composing the pulse width change section 230 may be driven by temperature codes T1 to TN generated by the temperature detection signals DET<1:n>.

Figure 6:
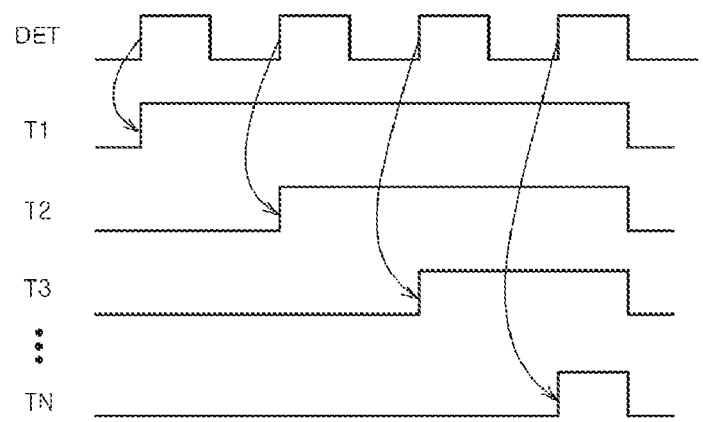
FIG. 6 is a timing diagram showing the generation of temperature codes according to an embodiment of the invention.

The temperature codes T1 to TN may be generated from the temperature detection signals DET<1:n> as shown in the exemplary timing diagram in FIG. 6.

The base current generation section 235 includes an NMOS transistor N2 coupled in parallel to the bypass section N1, the NMOS transistors N of the mode setting section 224, and the NMOS transistors N' of the pulse width change section 230. The base current generation section 235 is configured to discharge driving voltages Vstand/Vwide/Vnar so as to provide a minimum current when the pulse width change section 230 is not driven and there is no current through the pulse width change section 230, in response to a signal provided from the initial driving section 240. The driving voltages Vstand/Vwide/Vnar may include a room, or nominal, temperature voltage Vstand, a wide-width voltage Vwide having a wider pulse width than the room temperature voltage Vstand, and a narrow-width voltage Vnar having a narrower pulse width than the room temperature voltage Vstand.

The initial driving section 240 is a circuit section configured to continuously supply a voltage Vh higher than threshold voltages of the NMOS transistors N, N', N1, and N2. That is, the initial driving section 240 commonly provides a gate voltage to the respective gates of the bypass section N1, the NMOS transistors N of the mode setting section 224, the NMOS transistors of the pulse width change section 230 N', and the NMOS transistor N2 in the base current generation section 235. The initial driving section 240 may include an NMOS transistor N3 coupled in a diode form. The NMOS transistor N3 has a gate coupled to a capacitor C1 to continuously drive the NMOS transistor N3 coupled in a diode form.

In the pulse width control unit 210 configured in such a manner, the legs of the pulse width change section 230 are selectively driven by the temperature codes T1 to TN generated by the temperature detection signals DET<1:N>. That is, as the switches S' in the pulse width change section 230 are driven, the number of current discharge paths within the pulse width change section 230 is changed. According to the change in the number of current discharge paths, a current discharge amount is changed to eventually control a pulse width. Here, the output of the pulse width control unit 210 is decided by the sum of the amount of current discharged from the base current generation section 235 and the amount of current discharged from the pulse width change section 230.

For example, at a high temperature, a phase change layer may only need to be driven by a relatively low current. Therefore, all the temperature codes T1 to TN of the pulse width change section 230 are disabled and only the base current driving section 235 is driven, in order to apply only a minimum current to the phase change layer.

At room temperature, some of the temperature codes T1 to TN are enabled to drive some of the legs of the base current driving section 235, as well as the pulse width change section 230.

At a low temperature, a relatively high current is required. Therefore, all the temperature codes T1 to TN are enabled to drive all the legs of the base current driving section 235 and the pulse width change section 230 such that a maximum current may be provided.

Accordingly, a relatively large current is provided to the phase change layer at a lower than room temperature, and a relatively small current is provided to the phase change layer at a higher than room temperature.

At this time, the number of legs and the number of temperature codes T1 to TN may be varied depending on temperature ranges. That is, a larger numbers of legs and temperature codes may be used to provide a wider range of current depending on the temperature ranges. Furthermore, the pulse control unit 210 outputs a reset pulse control P_Ctrl_r or a set pulse control signal P_Ctrl_s according to the operation of the mode setting section 224.

Figure 7:
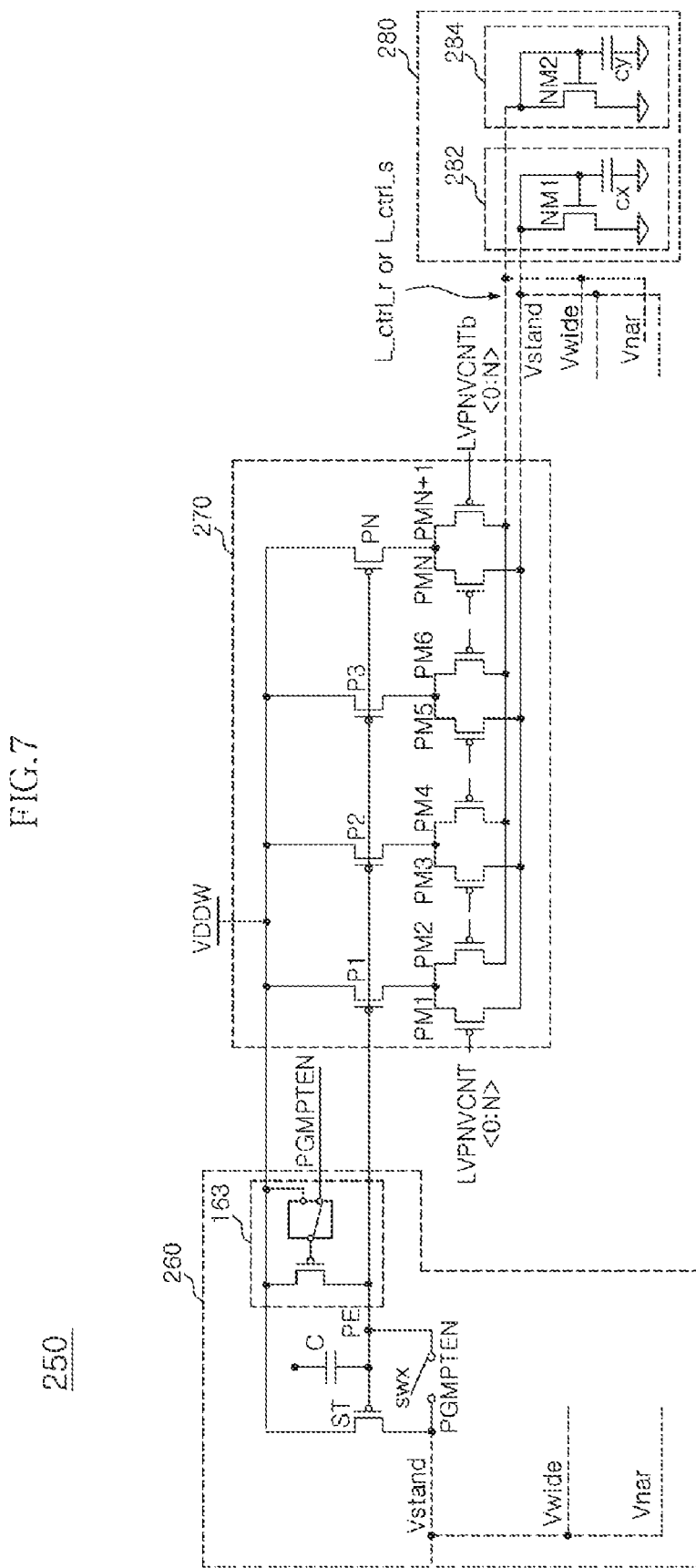
FIG. 7 is an internal circuit diagram of a level control unit according to an embodiment of the invention.

Referring to FIG. 7, the level control unit 250 includes a voltage setting section 260, a level setting section 270, and a potential providing section 280.

The voltage setting section 260 is configured to provide the driving voltages Vstan/Vwide/Vnar to the level setting section 270 in response to an enable signal PGMPTEN. The voltage setting section 260 may include an enable transistor PE configured to be driven in response to the enable signal PGMPTEN and a switching transistor ST configured to transfer one of the driving voltages Vstand/Vwide/Vnar according to an output voltage of the enable transistor PE. The enable transistor PE is configured to be driven in response to the enable signal PGMPTEN.

The gate of the switching transistor ST may be coupled to a capacitor C, and a switch SWX that may respond to the enable signal PGMPTEN may be provided between the gate and the drain of the transistor ST. Accordingly, when the enable signal PGMPTEN is enabled, the switching transistor ST is driven as a diode.

The level setting section 270 includes a plurality of differential legs coupled in parallel. Each differential leg includes a PMOS transistor P1 to PN and a corresponding pair of differential transistors PM1/PM2 to PMN/PMN+1, respectively. The PMOS transistors P1 to PN are configured to be driven in response to an output signal of the enable transistor PE, and the pairs of differential transistors PM1/PM2 to PN/PN+1 are coupled to the drains of the PMOS transistors P1 to PN and configured to be driven in response to level counting signal pairs LVPNVCNT<0:N> and LVPNVCNTb<0:N>. The pairs of differential transistors are pairs of PMOS transistors whose sources are coupled to each other, and receive the level counting signal pairs LVPNVCNT<0:N> and LVPNVCNTb<0:N> through the respective gates.

At this time, the PMOS transistors P1 to PN composing the plurality of differential legs may be designed in such a manner that the channel lengths W thereof sequentially increase, and the level counting signal pairs LVPNVCNT<0:N> and LVPNVCNTb<0:N> are signals which are generated from the temperature detection signals DET<1:N>. Since the PMOS transistors P1 to PN composing the plurality of differential legs have different sizes, the respective amounts of current flowing in the differential legs may differ from each other. Therefore, the amount of output current of the level setting section 270 is changed by voltage differences between the level counting signal pairs LVPNVCNT<0:N> and LVPNVCNTb<0:N>.

For example, at a higher than room temperature, one differential leg including a PMOS transistor having the smallest size is driven and conducted to provide a smaller current than at room temperature. At a cooler than room temperature, all the differential legs or one or more differential legs including a PMOS transistor having the largest size are driven and conducted to provide a larger current than at room temperature.

The potential supply section 280 includes a first pumping section 282 and a second pumping section 284. The first pumping section 282 is coupled to the drains of the differential transistors PM1, PM3, . . . PMN responding to the positive level counting signals LVPNVCNT<0:N>, and the second pumping section 284 is coupled to the drains of the differential transistors PM2, PM4, . . . PMN+1 responding to the negative level counting signals LVPNVCNTb<0:N>.

The first and second pumping sections 282 and 284 may have the same configuration. Each of the first and second pumping sections 282 and 284 includes an NMOS transistor NM1 and NM2, respectively, where the gate and drain are coupled to each other and a capacitor Cx or Cy respectively coupled between the gate of the NMOS transistor NM1 or NM2 and a ground terminal. As the differential legs are driven by the level counting signal pairs LVPNVCNT<0:N> and LVPNVCNTb<0:N> and the potential supply section 280 is driven, the current level of the level setting section 270 is varied to select any one of the driving voltages. Here, the output signal of the level control unit 250 becomes the reset level control signal L_Ctrl_r or the set level control signal L_Ctrl_s by the mode setting section 224 of the pulse width control unit 210 The level of the reset level control signal L_Ctrl_r or the set level control signal L_Ctrl_s may be controlled by pumping operation of the first and second pumping sections 282 and 284.

Figure 8:
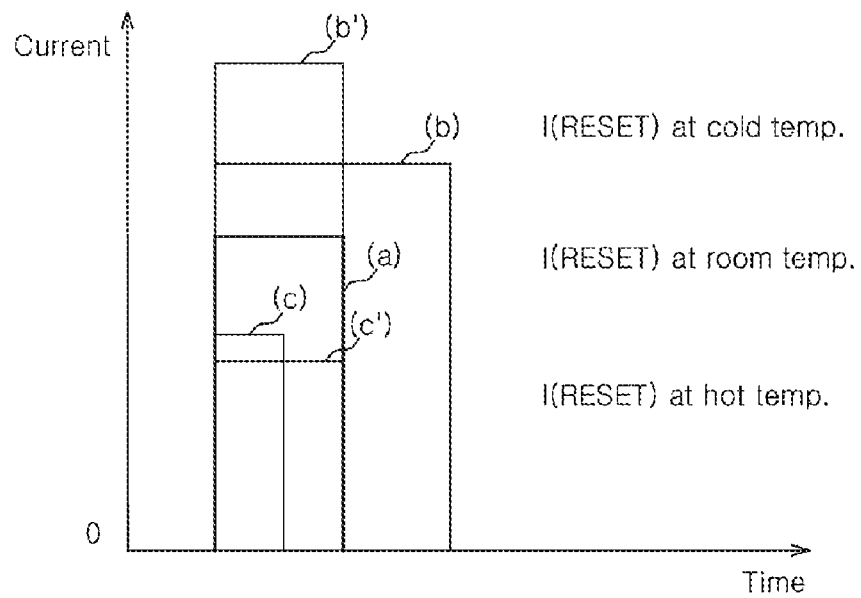
FIG. 8 is a graph showing output pulses of a first driver according to an embodiment of the invention.
Figure 9:
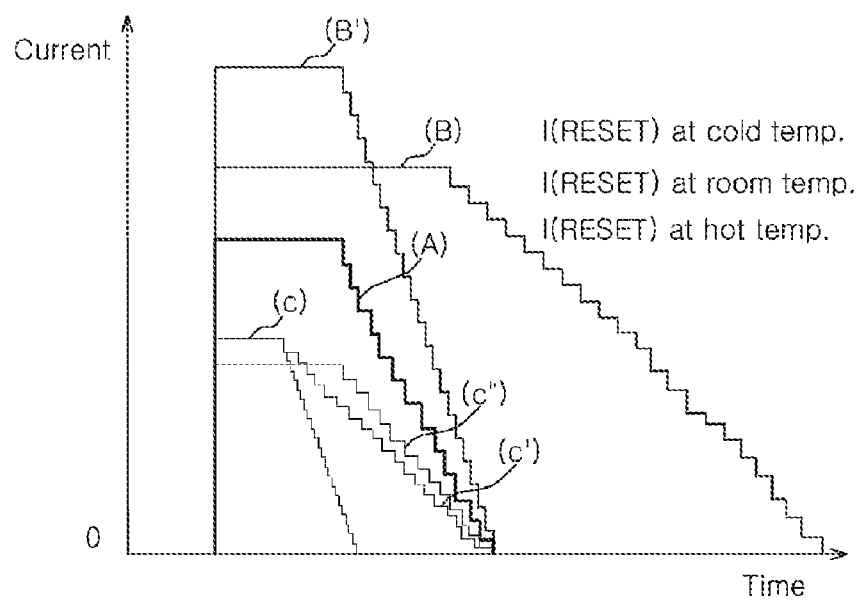
FIG. 9 is a graph showing output pulses of a second driver according to an embodiment of the invention.

Referring to FIGS. 1, 8, and 9, the write driver block 300 is configured to receive the control signals P_Ctrl_r, P_Ctrl_s, L_Ctrl_r, and L_Ctrl_s provided by the current control block 200 and output compensated set/reset pulses SET/RESET corresponding to a lower than room temperature, the room temperature, and a higher than room temperature. The write driver block 300 may include a first write driver 310 configured to receive the control signals P_Ctrl_r and L_Ctrl_r related to reset driving and a second write driver 350 configured to receive the control signals P_Ctrl_s and L_Ctrl_s related to set driving.

The first write driver 310 responds to the control signals P_Ctrl_r and L_Ctrl_r related to reset driving, which are generated by using the temperature detection signals. When the temperature of the internal circuit is low (that is, from −25° C. to 25° C.), the first write driver 310 generates and outputs a first cold-temperature reset pulse (b in FIG. 8) having a first level larger than the level of a reset pulse (a in FIG. 8) at room temperature (25° C. to 60° C.) and a first pulse width larger than the width of the reset pulse (a) at room temperature, or generates and outputs a second cold-temperature reset pulse (b') having the same pulse width as the reset pulse (a) at room temperature and a second level larger than the first level. Furthermore, when the temperature of the internal circuit is high (more than 60° C.), the first write driver 310 may generate a first hot-temperature reset pulse (c in FIG. 8) having a lower third level and a smaller pulse width than the reset pulse (a) at room temperature and a second hot-temperature reset pulse (c') having a lower level than the third level and the same pulse width as the reset pulse (a) at room temperature.

Referring to FIG. 9, when the temperature of the internal circuit is low, the second write driver 350 generates a first hot-temperature set pulse (B) having a first level larger than the level of a set pulse (A) at room temperature and a second pulse width larger than the pulse with of the set pulse (A) at room temperature and a second hot-temperature set pulse (B') having the same pulse width as the set pulse (A) at room temperature and a second level higher than the first level, in response to the control signals P_Ctrl_s and L_Ctrl_s related to set driving. Furthermore, when the temperature of the internal circuit is high, the second write driver 350 generates a third hot-temperature set pulse (C) having a third level lower than the level of the set pulse (A) at room temperature and a third pulse width smaller than the pulse width of the set pulse (A) at room temperature, a fourth hot-temperature set pulse (C') having the same level as the third hot-temperature set pulse (C) and a same pulse width as the set pulse (A), and a fifth hot-temperature set pulse (C") having a lower level than the fourth hot-temperature set pulse (C') but a same pulse width as the set pulse (A), in response to the control signals P_Ctrl_s and L_Ctrl_s related to set driving.

In this embodiment, the level width is simultaneously controlled without extending the pulse width unlimitedly, in order to provide a sufficient amount of current in a low-temperature driving mode. Therefore, it is possible to prevent disturbance occurring in adjacent memory cells.

The switching block 400 may include a first switch SW1 coupled between the first write driver 310 and the memory cell 170 and a second switch SW2 coupled between the second write driver 350 and the memory cell 170. The first switch SW1 is designed to be closed in the reset mode and selectively forms a current path between the first write driver 310 and the memory cell 170. The second switch SW2 is designed to be closed in the set mode and selectively forms a current path between the second write driver 350 and the memory cell 170.

The memory cell 170 includes a word line WL and a bit line BL crossing the word line WL. The word line WL is coupled to a switching element, and a storage medium is coupled between the switching element and the bit line BL. In this embodiment, a diode may be used as the switching element, and a phase change material may be used as the storage medium. Without being limited thereto, however, the storage medium may include any medium capable of storing data while having temperature dependency.

The semiconductor memory apparatus according to the embodiment detects the temperature of the internal circuit through the temperature detection block 100. The temperature detection signals generated by the temperature detection block 100 are inputted to the current control block 200 to generate control signals P_Ctrl_r, P_Ctrl_s, L_Ctrl_r, and L_Ctrl_s depending on temperature in each mode.

The control signals P_Ctrl_r, P_Ctrl_s, L_Ctrl_r, and L_Ctrl_s are inputted to the write driver block 300, and the first and second write drivers 310 and 350 of the write driver block 300 generates compensated set/reset pulses in response to the control signals P_Ctrl_r, P_Ctrl_s, L_Ctrl_r, and L_Ctrl_s, and provides the generated set/reset pulses to the memory cell 170.

When the temperature of the internal circuit is lower than room temperature, the current control block 200 outputs the control signals so as to provide set/reset pulses having a higher level and/or a larger pulse width than at room temperature. Accordingly, a current pulse having a relatively high intensity is applied to a cold-temperature phase change material having a phase change environment in which the temperature is lower than room temperature, thereby accomplishing a phase change corresponding to that at room temperature.

When the temperature of the internal circuit is high, the current control block 200 provides set/reset pulses having a lower level and/or a smaller pulse width than at room temperature. Accordingly, a current pulse having a relatively low intensity is applied to a hot-temperature phase change material having a phase change environment in which the temperature is higher than room temperature, and thus a phase change corresponding to that at room temperature occurs.

Accordingly, the phase changes of storage media having temperature dependency, for example, phase change materials, may be uniformized. Thus, a data storage error may be prevented, and the reliability of the semiconductor memory apparatus may be secured.

Furthermore, when a current pulse is to be applied in a low temperature state, the level as well as the pulse width may be controlled to prevent disturbance caused by the unlimited extension of the pulse width.

While certain embodiments have been described above, it will be understood to those skilled in the art that the embodiments described are by way of example only. Accordingly, the current control apparatus and the phase change memory described herein should not be limited based on the described embodiments. Rather, the current control apparatus and the phase change memory described herein should only be limited in light of the claims that follow when taken in conjunction with the above description and accompanying drawings.

What is claimed is:

1. A memory apparatus comprising:
   a temperature detection block configured to detect temperature of an internal circuit and output a temperature detection signal;
   a current control block configured to receive the temperature detection signal and generate a pulse control signal; and
   a write driver configured to provide a program pulse having a compensated level and width to a memory cell in response to the pulse control signal.

2. The memory apparatus according to claim 1, wherein the temperature detection block comprises:
   a bandgap signal generation unit configured to generate a reference voltage varying with temperature and a reference voltage constant with temperature; and
   a temperature voltage generation unit configured to generate the temperature detection signal by using the reference voltage varying with temperature and the reference voltage constant with temperature.

3. The memory apparatus according to claim 1, wherein the current control block comprises a pulse width control unit configured to control the width of the program pulse in response to the temperature detection signal.

4. The memory apparatus according to claim 3, wherein the pulse width control unit is configured to provide the pulse control signal indicating a larger width than a program pulse at room temperature when the temperature detection signal indicates temperature lower than room temperature, and provide the pulse control signal indicating a smaller width than the program pulse at room temperature when the temperature detection signal indicates temperature higher than room temperature.

5. The memory apparatus according to claim 4, wherein the pulse width control unit comprises:
   an initial setting section configured to decide an operation mode of the program pulse and set rising and falling times;
   a pulse width change section coupled to the initial setting section and control a pulse width in response to a temperature code generated by using the temperature detection signal;
   a base current setting section configured to provide a constant current when the pulse width change section is not driven; and
   an initial driving section configured to continuously drive the pulse width change section.

6. The memory apparatus according to claim 5, wherein the pulse width change section comprises a plurality of legs coupled in parallel between the initial setting section and a ground terminal,
   each of the legs comprises:
   a switch configured to be opened and closed in response to the temperature code; and a transistor, coupled to the switch, designed to be driven at all times by a constant voltage, and the temperature code is generated to close all the switches in the plurality of legs at a predetermined low temperature, and generated to close only one of the switches in the plurality of legs at a predetermined hot temperature.

7. The memory apparatus according to claim 1, wherein the current control block comprises a level control unit configured to control the level of the program pulse in response to the temperature detection signal.

8. The memory apparatus according to claim 7, wherein the level control unit provides the pulse control signal indicating a higher level than a program pulse at room temperature when the temperature detection signal indicates lower temperature than room temperature, and provides the pulse control signal indicating a lower level than the program pulse at room temperature when the temperature detection signal indicates higher temperature than room temperature.

9. The memory apparatus according to claim 8, wherein the level control unit comprises:
   a transistor configured to be driven in response to a signal generated by an enable signal; and
   a plurality of legs coupled to the transistor and each comprising a pair of differential transistors configured to receive a level counting signal pair generated by counting the temperature detection signal.

10. The memory apparatus according to claim 8, wherein the transistors in the plurality of legs have different sizes.

11. The memory apparatus according to claim 8, wherein the level control unit further comprises a potential supply section configured to pump a level of an output potential.

12. The memory apparatus according to claim 1, wherein the current control block comprises:
   a pulse width control unit configured to control the width of the program pulse in response to the temperature detection signal; and
   a level control unit configured to control the level of the program pulse in response to the temperature detection signal.

13. The memory apparatus according to claim 12, wherein the pulse width control unit provides the pulse control signal indicating a larger width than or the same width as a program pulse at room temperature, when the temperature detection signal indicates a temperature lower than room temperature, and provides the program pulse control signal indicating a smaller width than the program pulse at room temperature, when the temperature detection signal indicates a temperature higher than room temperature.

14. The memory apparatus according to claim 13, wherein the level control unit provides the pulse control signal indicating a higher level than the program pulse at room temperature when the temperature detection signal indicates the low temperature, and provides the pulse control signal indicating a lower level than the program pulse at room temperature when the temperature detection signal indicates the hot temperature.

15. The memory apparatus according to claim 1, wherein the memory cell comprises a phase change memory cell.

16. The memory apparatus according to claim 15, wherein the write driver block comprises a first write driver for reset driving and a second write driver for set driving.

17. The memory apparatus according to claim 16, wherein the first driver is configured to provide a reset program pulse having a larger pulse width and/or a higher level than the program pulse at room temperature when the detected temperature is lower than room temperature, and
   the second driver is configured to provide a set program pulse having a smaller pulse width, a lower level, and/or a gentler slope than the program pulse at room temperature when the detected temperature is higher than room temperature.

18. The memory apparatus according to claim 16, further comprising a switching block provided between the write driver block and the memory cell and configured to selectively provide outputs of the first and second write drivers to the memory cell.

19. A method for driving a memory apparatus, comprising:
   generating a temperature detection signal by measuring internal temperature of a memory circuit;
   generating a plurality of pulse control signals in response to the temperature detection signal; and
   generating a program pulse in response to the pulse control signals.

20. The method according to claim 19, wherein, in generating the program pulse,
   when the temperature detection signal indicates temperature lower than room temperature, the program pulse having a larger pulse width and/or a higher level than at room temperature is generated, and
   when the temperature detection signal indicates temperature higher than room temperature, the program pulse having a smaller pulse width and/or a lower level than at the room temperature is generated.

* * * * *